US006916984B2

(12) United States Patent
Hou

(10) Patent No.: US 6,916,984 B2
(45) Date of Patent: Jul. 12, 2005

(54) SHIELDING COATING FOR PREVENTING FROM OUTLEAKAGE OF ELECTROMAGNETIC WAVE

(76) Inventor: Pon-Wei Hou, 3F No. 8, Hsin Aun Road, Science-Based Industrial Park, HsinChu (TW)

( * ) Notice: Subject to any disclaimer, the term of this patent is extended or adjusted under 35 U.S.C. 154(b) by 7 days.

(21) Appl. No.: 10/628,258

(22) Filed: Jul. 29, 2003

(65) Prior Publication Data

US 2005/0023019 A1 Feb. 3, 2005

(51) Int. Cl.$^7$ ............................................. H05K 9/00
(52) U.S. Cl. ................................................. 174/35 MS
(58) Field of Search ...................... 174/35 MS, 35 R; 361/816, 818

(56) References Cited

U.S. PATENT DOCUMENTS 4,814,546 A * 3/1989 Whitney et al. ............... 174/36

* cited by examiner

Primary Examiner—Hung V. Ngo
(74) Attorney, Agent, or Firm—Troxell Law Office, PLLC

(57) ABSTRACT

A shielding coating for preventing from outleakage of electromagnetic wave is adapted for shielding electrical products, and electrical parts, traces and connecting lines of the electrical products. The shielding coating comprises an energy transference unit or a shielding unit for cooperating with the energy transference unit. The energy transference unit includes insulated compositions selected from Magnetic Crystal Powder, Rubber/Silicone, Zinc Oxide, Magnesium Oxide, Light Processing Oil, Thylene Thiourea, and Stearic Acid etc, which are mixed by proportional weight for energy transference. The energy transference unit is provided at one side or at more than one side of the electrical products, and electrical parts, traces and connecting lines of the electrical products for limiting radiation of the electromagnetic wave and transferring the electromagnetic energy to heat energy, thereby reducing the radiation of the electromagnetic wave, and accordingly protecting the electrical products, environment and human beings from radiation effect of electromagnetic wave.

4 Claims, 5 Drawing Sheets

SHIELDING COATING FOR PREVENTING FROM OUTLEAKAGE OF ELECTROMAGNETIC WAVE

BACKGROUND OF THE INVENTION

1. Field of the Invention

The present invention relates to a shielding coating preventing from outleakage of electromagnetic wave, and particularly to a shielding coating adaptive to transfer electromagnetic energy of electrical products, and electrical parts, traces and connecting lines of the electrical products to heat energy, thereby preventing from outleakage of electromagnetic wave.

2. Related Art

Electrical products, electrical parts, traces and connecting lines tend to produce radiation effect of electromagnetic wave, which not only leads to abnormal work of the electrical products, but also contaminates environment and even hurts the human beings. On the other hand, in the information age, electrical products pursuit of miniature and high-speed transmission, making radiation effect of electromagnetic wave more serious.

Electrical parts in the electrical products, such as Clock Generator, Integrated Circuit (IC) and Central Processing Unit (CPU) etc, often form electric loops when running, and so are apt to produce electromagnetic wave. Moreover, traces and connecting lines of the electrical products may always produce electromagnetic wave. Antenna effect, namely radiation effect of electromagnetic wave, is subject to length and surrounding area of the traces. In addition, it is important that one cannot use personal computer in airplane, because an electromagnetic wave which may be generated from computer during operating and might influence the electrical system of the airplane, thereby resulting in danger of fly.

Conductive materials, for example, copper fOil, aluminum fOil and short-woven metal lines etc, are commonly used to shield electromagnetic wave. Inductance effect, for instance, Ferrite Core is also employed to overcome this problem. Additionally, capacitance effect, for example, by adding bypass capacities or by changing antenna length, has been tried to reduce radiation effect of electromagnetic wave.

However, the above methods can not overcome the problem in substance. According to Conservation of Energy, electromagnetic wave may be masked at some parts of the electrical products, but at the same time electromagnetic wave may moves to another parts. Similarly, radiation effect of electromagnetic wave of some frequency of electrical products may be masked, but at the same time that of another frequency may occur. Thus, the conventional methods cannot overcome the problem of radiation effect of electromagnetic wave.

SUMMARY OF THE INVENTION

Accordingly, an object of the present invention is to provide a shielding coating which transfers electromagnetic energy to heat energy, thereby reducing electromagnetic wave of electrical products and preventing from outleakage of electromagnetic wave, accordingly protecting the electrical products, environment and human beings from radiation effect of electromagnetic wave.

A shielding coating for preventing from outleakage of electromagnetic wave comprises an energy transference unit, which includes insulated compositions surrounding radiation portions of the electrical products for transferring electromagnetic energy to heat energy thereby reducing radiation of electromagnetic wave and releasing the heat energy.

The insulated composition is selected from Magnetic Crystal Powder, Rubber/Silicon, Zinc Oxide, Magnesium Oxide, Light Processing Oil, hypo-second group sulfur, and Stearic Acid, which are mixed complying with proportional weight for energy transference.

The shielding coating for preventing from outleakage of electromagnetic wave further comprises a shielding unit, which cooperates with the energy transference unit and locates at one side or more than one side of the electrical products, and electrical parts, traces and connecting lines of the electrical products, thereby limiting the electromagnetic wave for energy transference.

DESCRIPTION OF THE PREFERRED EMBODIMENTS

Figure 1:
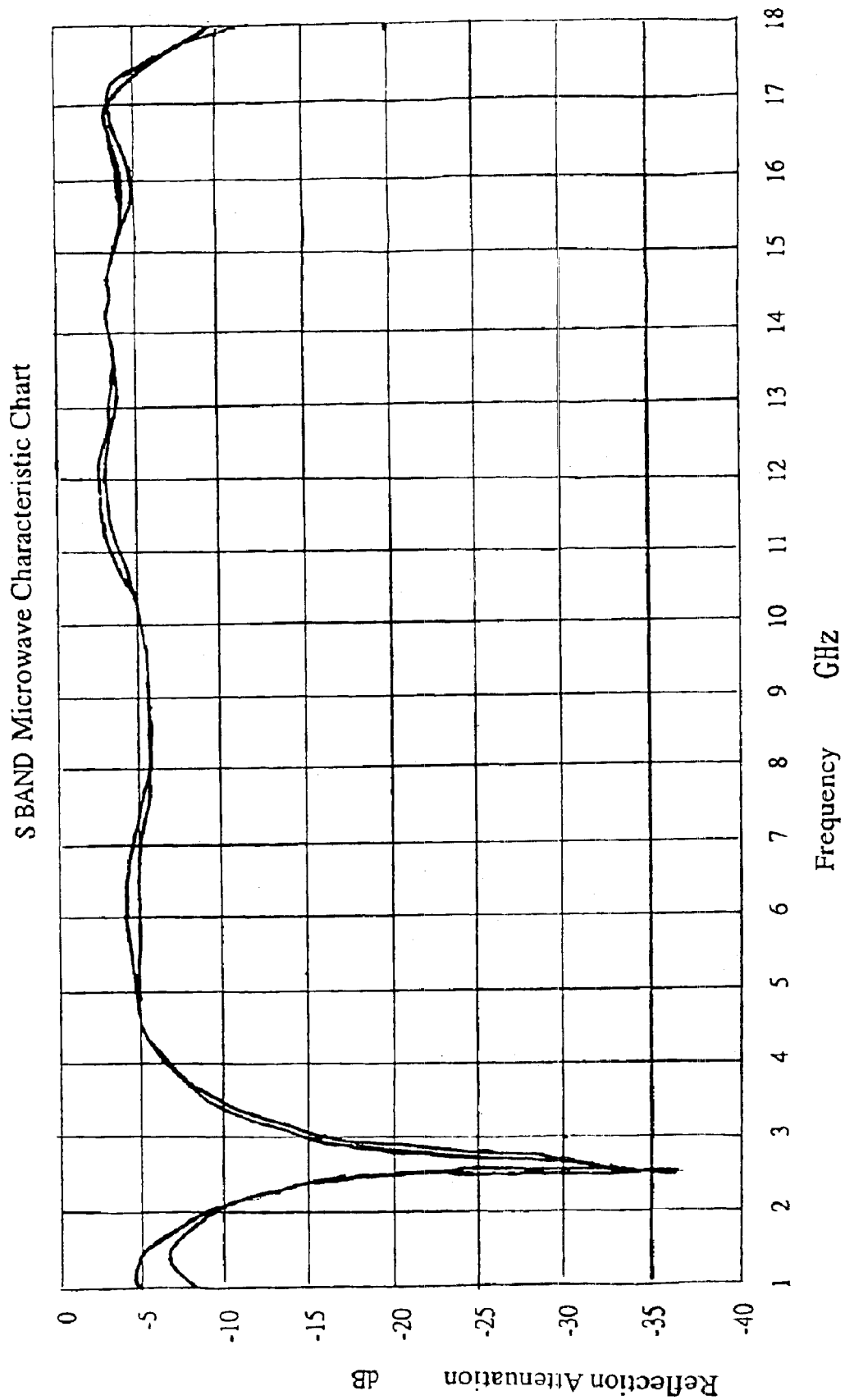
FIG. 1 is a microwave characteristic chart of a shielding coating of the present invention, wherein electromagnetic wave from mobile phones (S frequency band of 2–4 GHz) acts as experiment object.

With reference to FIG. 1, a shielding coating for preventing from outleakage of electromagnetic wave comprises an energy transference unit or a shielding unit for cooperating with the energy transference unit. The energy transference unit comprises insulated compositions selected from Magnetic Crystal Powder, Rubber/Silicone, Zinc Oxide, Magnesium Oxide, Light Processing Oil, Thylene Thiourea, and Stearic Acid etc, which are mixed complying with proportional weight for energy transference.

The Magnetic Crystal Powder and the Rubber/Silicone are 90 percent of the insulated compositions by weight. The Magnetic Crystal Powder (e.g. available from Fluka Inc., Switzerland) has a particle diameter of 1–10$\mu$, density of 1–10 g/ml, weight ratio in a range of 30–85 percent. The Rubber/Silicone (e.g. available from Du Pont Inc., US) has a weight ratio of 5–60 percent. The Zinc Oxide and the Magnesium Oxide respectively has weight ratio in a range of 1–3 percent. The Light Processing Oil has weight ratio in a range of 1–5 percent. The Thylene Thiourea and the Stearic Acid respectively has weight ratio in a range of 1–5 percent. The blend of the insulated compositions are heated for about 30 minutes at temperature of about 165 centigrade to become a hard sheet with a thickness of 0.1 to 10 mm and a size of 25×25 cm. The insulated compositions and the shielding unit are placed around electromagnetic wave radiation portions of electrical products, and electrical parts, traces and connecting lines of the electrical products. According to radiation direction of electromagnetic wave, the electromagnetic wave radiation portions may be at one side, at more than one side or around and/or cover the periphery of the electrical parts, traces and connecting lines. The energy transference unit may be of a sponge shape by different process. The electromagnetic wave of the electrical products, and electrical parts, traces and connecting lines of the electrical products are limited therearound, and are transferred to heat energy. Thus, little electromagnetic wave leaks out. The temperature of the heat is lower than 1 centigrade. Referring to FIG. 1, the experiment object is electromagnetic wave emitted by a mobile phone. Coordinate X represents electromagnetic wave frequency (GHz), and Coordinate Y represents reflection attenuation (db). The experiment proves that the electromagnetic wave energy can be transferred to heat of 1 centigrade, which neither damages the electrical products nor pollutes environment.

A second shielding unit may be added to enhance the transference capability of the energy transference unit. The second shielding unit may be a metal sheet, such as Gold, Silver, Copper, Iron, Aluminum, Platinum, Stainless Steel, alloy, or an electromagnetic wave shielding film that is not grounded.

Figure 2:
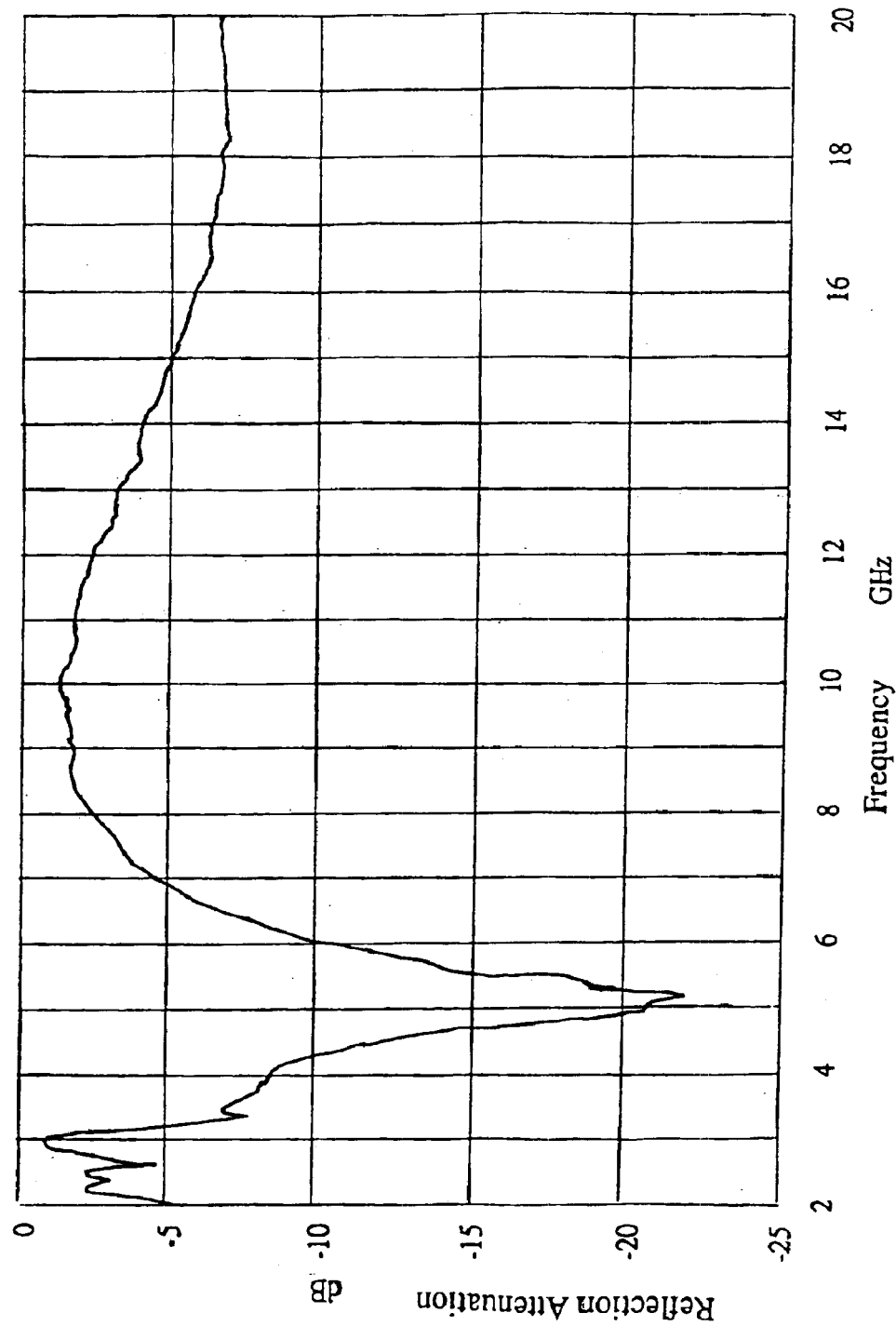
FIGS. 2–5 are microwave characteristic charts of the shielding coating of the present invention, wherein electromagnetic wave at different frequency bands acts as experiment object.
Figure 3:
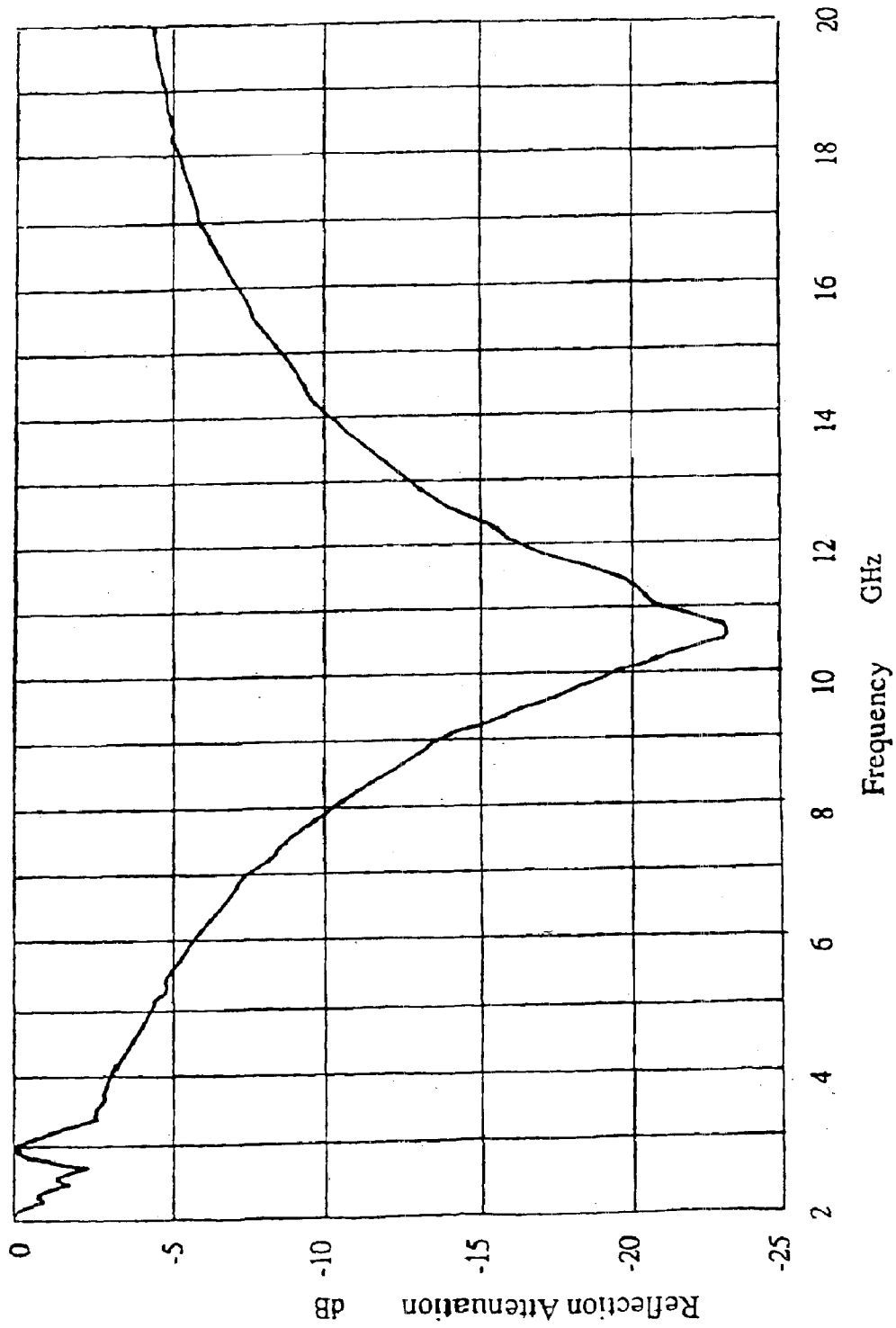
Figure 4:
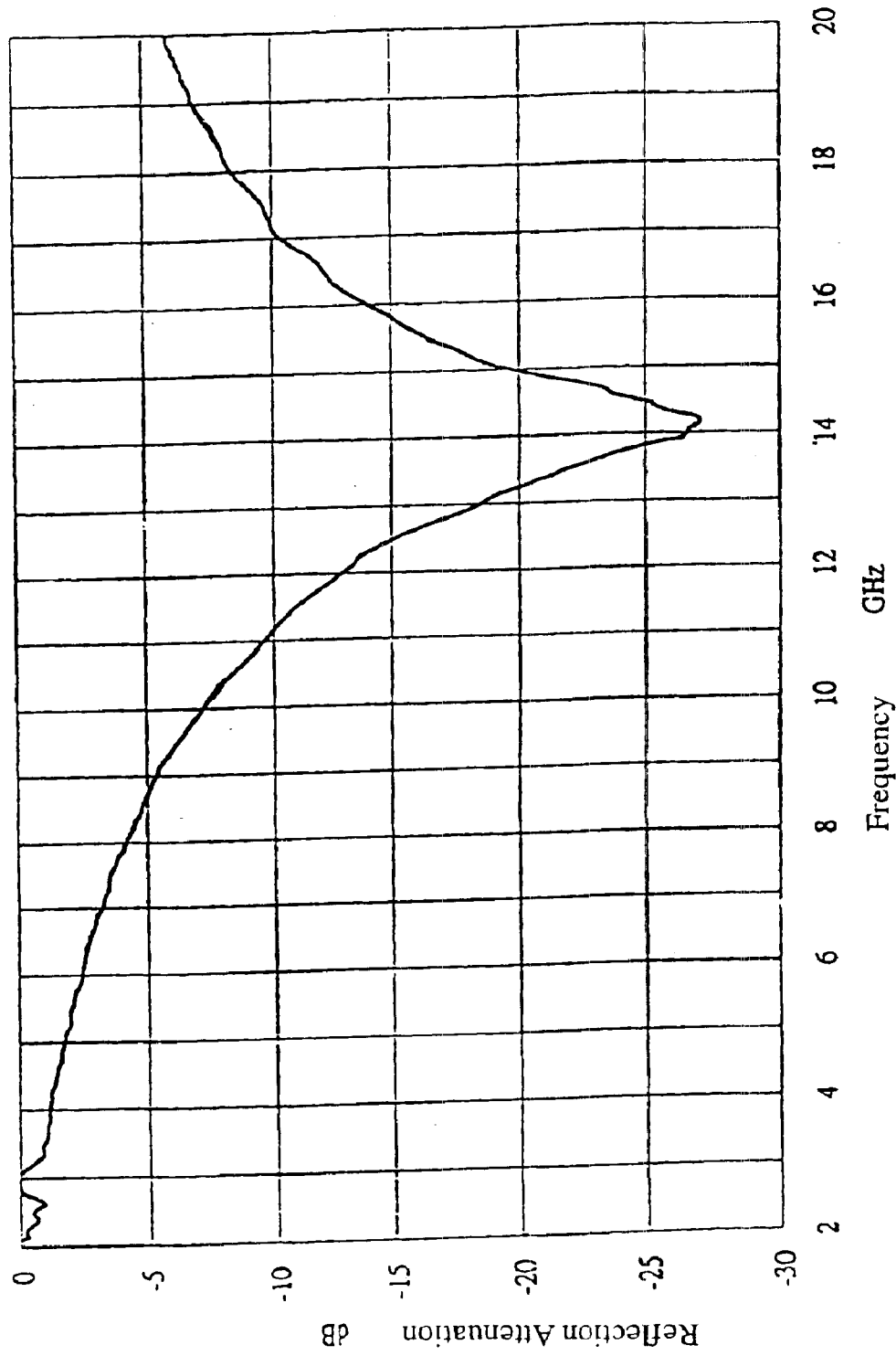
Figure 5:
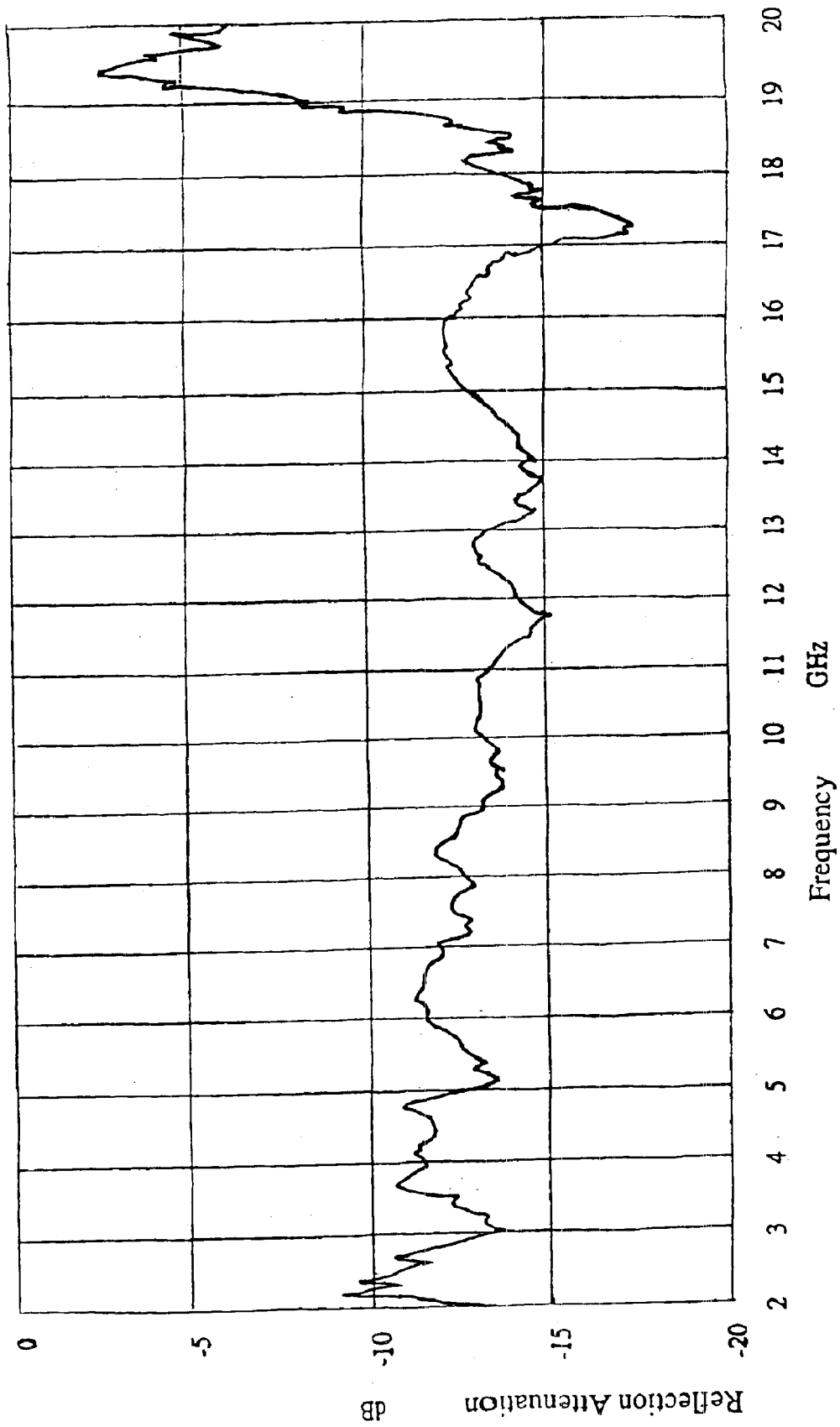

Referring to FIGS. 2–5, the experiment objects are electromagnetic wave emitted at different frequency. Coordinate X represents electromagnetic wave frequency (GHz), and Coordinate Y represents reflection attenuation (db). FIG. 2 shows the experiment result at C frequency band in a range of 4–7 GHz; FIG. 3 shows the experiment result at X frequency band in a range of 8–12 GHz; FIG. 4 shows the experiment result at Ku frequency band in a range of 12–18 GHz; FIG. 5 shows the experiment result at lower or higher frequency band. The experiments all prove that the electromagnetic wave energy can be transferred to heat of 1 centigrade, which neither damages the electrical products nor pollutes environment.

On the other hand, the number of the energy transference unit may vary to adapt for different frequency band of electromagnetic wave. For example, more energy transference units are provided for wider frequency band of electromagnetic wave.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A shielding coating for preventing from outleakage of electromagnetic wave, being adapted for shielding electrical products, and electrical parts, traces and connecting lines of the electrical products, and comprising an energy transference unit or a shielding unit cooperating with the energy transference unit, the energy transference unit including insulated compositions selected from Magnetic Crystal Powder, Rubber/Silicone, Zinc Oxide, Magnesium Oxide, Light Processing Oil, Thylene Thiourea, and Stearic Acid, which are mixed by proportional weight for energy transference, wherein the Magnetic Crystal Powder and the Rubber/Silicone are 50–90 percent of the insulated compositions by weight.

2. A shielding coating for preventing from outleakage of electromagnetic wave, being adapted for shielding electrical products, and electrical parts, traces and connecting lines of the electrical products, and comprising an energy transference unit or a shielding unit cooperating with the energy transference unit, the energy transference unit including insulated compositions selected from Magnetic Crystal Powder, Rubber/Silicone, Zinc Oxide, Magnesium Oxide, Light Processing Oil, Thylene Thiourea, and Stearic Acid, which are mixed by proportional weight for energy transference, wherein the Magnetic Crystal Powder has a particle diameter of 1–10$\mu$, density of 1–10 g/ml, weight ratio in a range of 30–85 percent, and wherein the Rubber/Silicone has a weight ratio of 5–60 percent.

3. A shielding coating for preventing from outleakage of electromagnetic wave, being adapted for shielding electrical products, and electrical parts, traces and connecting lines of the electrical products, and comprising an energy transference unit or a shielding unit cooperating with the energy transference unit, the energy transference unit including insulated compositions selected from Magnetic Crystal Powder, Rubber/Silicone, Zinc Oxide, Magnesium Oxide, Light Processing Oil, Thylene Thiourea, and Stearic Acid, which are mixed by proportional weight for energy transference, wherein the Zinc Oxide and the Magnesium Oxide respectively has weight ratio in a range of 0.5–1.5 percent.

4. A shielding coating for preventing from outleakage of electromagnetic wave, being adapted for shielding electrical products, and electrical parts, traces and connecting lines of the electrical products, and comprising an energy transference unit or a shielding unit cooperating with the energy transference unit, the energy transference unit including insulated compositions selected from Magnetic Crystal Powder, Rubber/Silicone, Zinc Oxide, Magnesium Oxide, Light Processing Oil, Thylene Thiourea, and Stearic Acid, which are mixed by proportional weight for energy transference, wherein the Light Processing Oil has weight ratio in a range of 1–5 percent, and wherein the Thylene Thiourea and the Stearic Acid respectively has weight ratio in a range of 1–5 percent.

\* \* \* \* \*